(12) United States Patent
Wang

(10) Patent No.: US 7,049,663 B2
(45) Date of Patent: May 23, 2006

(54) ESD PROTECTION DEVICE WITH HIGH VOLTAGE AND NEGATIVE VOLTAGE TOLERANCE

(75) Inventor: Tai-Ho Wang, Hsinchu (TW)

(73) Assignee: Sunplus Technology Co,Ltd., Hsinchu (TW)

( * ) Notice: Subject to any disclaimer, the term of this patent is extended or adjusted under 35 U.S.C. 154(b) by 76 days.

(21) Appl. No.: 10/711,510

(22) Filed: Sep. 23, 2004

(65) Prior Publication Data

US 2005/0205937 A1    Sep. 22, 2005

(30) Foreign Application Priority Data

Mar. 22, 2004    (TW) .................................. 93107620

(51) Int. Cl.
*H01L 23/62* (2006.01)

(52) U.S. Cl. ...................... 257/355; 257/173; 257/361; 257/487; 257/490; 257/494; 257/495; 257/546

(58) Field of Classification Search ..................... None
See application file for complete search history.

(56) References Cited

U.S. PATENT DOCUMENTS 6,501,137 B1 * 12/2002 Yu et al. ..................... 257/355
2005/0133870 A1 * 6/2005 Manna et al. ............... 257/355

* cited by examiner

*Primary Examiner*—Andy Huynh
(74) *Attorney, Agent, or Firm*—Jiang Chyun IP Office

(57) ABSTRACT

An electrostatic discharge protection device with high voltage and negative voltage tolerance is provided. The electrostatic discharge protection device comprises: a first type substrate; a first type well inside the first type substrate, the first type well being floating; a second type well inside the first type substrate, the second type well separating the first type well from the first type substrate, the second type well being coupled to a first voltage line; a second type first doped region inside the first type well and coupled to a second voltage line; a second type second doped region inside the first type well and coupled to the pad; and an isolation structure between the second type first doped region and the second type second doped region.

15 Claims, 2 Drawing Sheets

ESD PROTECTION DEVICE WITH HIGH VOLTAGE AND NEGATIVE VOLTAGE TOLERANCE

CROSS-REFERENCE TO RELATED APPLICATION

This application claims the priority benefit of Taiwan application serial no. 93107620, filed on Mar. 22, 2004.

BACKGROUND OF THE INVENTION

1. Field of the Invention

The present invention relates to an electrostatic discharge (ESD) protection device. More specifically, the present invention relates to an ESD protection device with both positive voltage and negative voltage tolerance.

2. Description of Related Art

ESD damage is usually caused by direct electrostatic discharge from a charged conductor to an electrostatic discharge sensitive device (ESDS), electrostatic discharge from the ESDS or by field-induced discharges. ESD simulation models include the human-body model (HBM), the machine model (MM), and the charge-device model (CDM). Electronic components and circuits, which are not provided with suitable protection, are highly susceptible to ESD damage.

Since the electronic products are required to be miniaturized and light-weighted, the sizes of the components in the integrated circuitry need to shrink. Accordingly, the IC designers have to consider ESD protection capability of the internal circuit and adjust the design of the internal circuit, in order to prevent the devices on the IC from being damaged by ESD voltage. Since ESD voltage is much larger than the power supply voltage, ESD voltage will damage adjacent semiconductor devices when the ESD phenomenon occurs. Hence, it is very important to prevent ESD voltage from entering into the internal circuit. In order to prevent ESD voltage from entering the internal circuit of an IC and causing damage, adequate ESD protection is required for the IC.

The input/output (I/O) terminals in most ICs operate either using only positive (or high) voltage signals, or only negative voltage signals. Hence, traditional ESD protection devices provide ESD protection for the I/O terminals of a single working voltage level (either positive or negative voltage). However, as electronic products become multi-functional, the IC needs to output or input positive and negative voltage signals in one connecting terminal. For example, a source driver IC of a LCD panel is required to output positive or negative voltage signals in one connecting terminal (the channel for driving the LCD panel). For the traditional ESD protection devices, it is impossible to offer ESD protection for positive and negative voltages by a single ESD protection device. Hence an improved ESD protection device having positive voltage as well as negative voltage tolerance is required to enable devices to withstand positive as well as negative ESD voltages at the same time.

SUMMARY OF THE INVENTION

One object of the present invention is to provide an ESD protection device with positive voltage and negative voltage tolerance. Regardless the signal of the protected circuit is a positive voltage signal or a negative voltage signal (or both), the ESD protection device is able to provide both Vdd mode and Vss mode ESD protection.

Another object of the present invention is to provide an ESD protection device with positive voltage and negative voltage tolerance, and the ESD protection device can quickly bypass the electrostatic discharge pulse out of the protected circuit.

The present invention provides an electrostatic discharge protection device with positive voltage and negative voltage tolerance, the device being connected to a pad in an integrated circuit, the device comprising: a first type substrate; a first type well inside the first type substrate, the first type well being floating; a second type well inside the first type substrate, the second type well separates the first type well from the first type substrate, the second type well being coupled to a first voltage line; a second type first doped region inside the first type well and coupled to a second voltage line; a second type second doped region inside the first type well and coupled to the pad; and an isolation structure between the second type first doped region and the second type second doped region.

In one embodiment of the present invention, the first type is P type and the second type is N type; the second type well comprises a deep N well or comprises an N buried layer (NBL) and a high voltage N well; the isolation structure is a field oxide region or a shallow trench isolation (STI) region; the voltage of the first voltage line is a system voltage, and the voltage of the second voltage line is a ground voltage.

The present invention also provides an electrostatic discharge protection device with positive voltage and negative voltage tolerance, for protecting an internal circuit in an integrated circuit, the internal circuit comprising at least one positive voltage input/output terminal and one negative voltage input/output terminal, the device comprising: a first type substrate; a first type first floating well inside the first type substrate; a second type first well inside the first type substrate, the second type first well separates the first type first floating well from the first type substrate, the second type first well being coupled to a system voltage line; a second type first doped region inside the first type first floating well and coupled to the system voltage line; a second type second doped region inside the first type first floating well and coupled to the high voltage input/output terminal; a first isolation structure between the second type first doped region and the second type second doped region; a first type second floating well inside the first type substrate; a second type second well inside the first type substrate, the second type second well separating the first type second floating well from the first type substrate, the second type second well being coupled to a ground voltage line; a second type third doped region inside the first type second floating well and coupled to a ground voltage line; a second type fourth doped region inside the first type second floating well and coupled to the negative voltage input/output terminal; and a second isolation structure between the second type third doped region and the second type fourth doped region.

The present invention uses the floating first type wells (e.g., the P-type well), the isolation structure (e.g., the field oxide region) and the transistor structure (e.g., the NPN transistor) that is turned on during an electrostatic discharge, to provide ESD protection. Because the first type well is floating, when an electrostatic pulse occurs, the PN junction in the ESD protection device breaks down and hence, a transient current is generated. The transient current turns on the transistors in the ESD protection device (including the lateral transistor and the vertical transistor). Hence, the ESD protection device of the present invention introduces the electrostatic pulse to the system voltage line or the ground line so as to prevent the internal circuit from damage caused due to ESD.

The above is a brief description of some limitations in the prior art and advantages of the present invention. Other features, advantages and embodiments of the present invention will be apparent to those skilled in the art from the following description, accompanying drawings and appended claims.

BRIEF DESCRIPTION OF THE DRAWINGS

The preferred embodiments of the invention will hereinafter be described in conjunction with the appended drawings provided to illustrate and not to limit the invention, wherein like designations denote like elements.

DESCRIPTION OF EMBODIMENTS

A large number of ICs output (or input) positive and negative voltage signals in a single connecting terminal. For example, a source driver IC of a LCD panel is required to output positive voltage as well as negative voltage signals in a single connecting terminal (the channel for driving the LCD panel). Hence, according to one embodiment of the present invention, an ESD protection device having positive voltage and negative voltage tolerance is provided for ESD protection.

Figure 1:
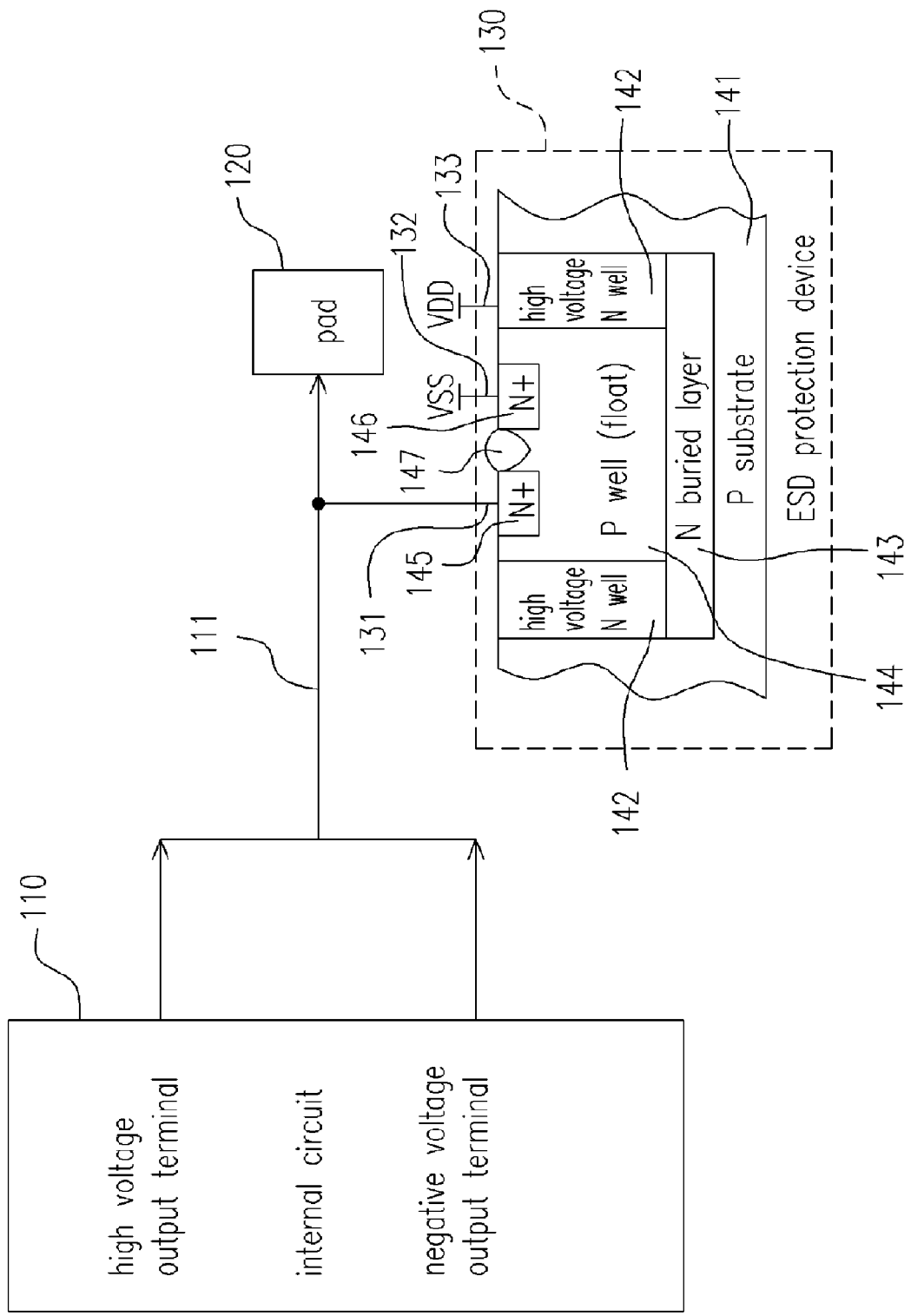
FIG. 1 illustrates the circuit diagram of an ESD protection device providing both high and negative voltage protection, in accordance with one embodiment of the present invention.

FIG. 1 illustrates the circuit diagram of an ESD protection device providing both positive and negative voltage protection, in accordance with one embodiment of the present invention. Within the IC package, an internal circuit 110 is the circuit being protected by an ESD protection device 130. Pad (bonding pad) 120 is a coupling element that connects internal circuit 110 to the lead of the IC package. Internal circuit 110 outputs both a high (positive) voltage signal and a negative voltage signal via pad 120. Hence, working voltage of output signal 111 transmitted via pad 120 ranges for example, from a high voltage to a negative voltage (e.g. +6V~−3V). Hence, it is necessary to ensure ESD protection device 130 not to be initiated within the positive-to-negative working voltage range of the IC.

ESD protection device 130 provides protection for both positive and negative voltages. According to one embodiment of the present invention, as shown in FIG. 1, ESD protection device 130 comprises P substrate 141, an N well comprising high voltage N well (HVNW) 142 and N buried layer (NBL) 143, P well 144, N doped region 145, N doped region 146 and an isolation region comprising field oxide region 147.

P well 144 is formed in the P substrate 141 and is in a floating state. The N well comprising high voltage N well 142 and N buried layer 143 is formed in the P substrate 141 and separates P well 144 from the P substrate 141. The N well is coupled to the discharging terminal 133. N doped region 145 is formed in the P well 144 and is coupled to the ESD protection terminal 131. N doped region 146 is formed in the P well 144 and is coupled to the discharging terminal 132. Field oxide region 147 is formed between the N doped regions 145 and 146.

The above isolation structure, in addition to the field oxide region, can also be constructed by using an STI region or other isolation structures. The N well, comprising high voltage N well 142 and N buried layer 143, can also be constructed by using a deep N well or other N wells. These variations fall within the scope of the present invention.

Referring to FIG. 1, in accordance with one embodiment of the present invention, the ESD protection terminal 131 of the ESD protection device 130 is coupled to the pad 120; the discharging terminal 132 is coupled to a ground voltage line VSS; the discharging terminal 133 is coupled to a system voltage line VDD. When internal circuit 110 outputs a high voltage (for example, +6V) signal, the junction of N doped region 145 and P well 144 functions as a reverse-biased diode. The voltage of floating P well 144 $V_{PW}$ is close to the ground voltage VSS as no current (or a very small reverse saturation current) flows through it. At the same time, the base-emitter voltage $V_{BE}$ across a lateral NPN transistor (for example, formed by the N doped region 145, P well 144, and the N doped region 146) and a vertical NPN transistor (for example, formed by the N doped region 145, the P well 144, and the N buried layer 143) is equal to the difference of $V_{PW}$ and VSS ($V_{PW}$–VSS). This base-emitter voltage $V_{BE}$ (=$V_{PW}$–VSS) is lower than the threshold voltage (e.g. 0.7V) for turning on a transistor. Hence, the ESD protection device 130 remains in a cut-off state.

When the internal circuit 110 outputs a negative voltage (for example, −3V) signal, the junction of N doped region 146 and the P well 144 (as well as the junction of the N well and the P well 144) functions as a reverse-biased diode. The voltage of the floating P well 144 $V_{PW}$ is almost equal to the voltage of pad 120 VPAD as no current (or a very small reverse saturation current) flowing through it. At the same time, the base-emitter voltage $V_{BE}$ of the lateral NPN transistor and the vertical NPN transistor is equal to $V_{PW}$–$V_{PAD}$, which is lower than the threshold voltage (i.e., 0.7V) for turning on a transistor. Hence, the ESD protection device 130 remains in a cut-off state.

When a positive electrostatic pulse, which is generally much higher than the system voltage VDD, enters the internal circuit 110 via the pad 120, the reverse-biased junction formed between N doped region 145 and the P well 144 breaks down. Hence, a high current flows from N doped region 145 through the P well 144. This high current immediately raises the voltage $V_{PW}$ of floating P well 144 due to the internal resistance. Hence, the base-emitter voltage $V_{BE}$ of the lateral NPN transistor and the vertical NPN transistor become larger than the threshold voltage for turning on the transistors. Therefore, the ESD protection device 130 is turned on quickly. As ESD protection device 130 is turned on, the positive electrostatic pulse is bypassed to the system voltage line VDD via the N doped region 145, through the P well 144 and the N well comprising the high voltage N well 142 and the N buried layer 143. This mode of operating ESD protection device 130, which comprises introducing the positive electrostatic pulse into the voltage line VDD, is called a positive pulse VDD mode. Also, as ESD protection device 130 is turned on, the positive electrostatic pulse is bypassed to the ground voltage line VSS via the N doped region 145, through the P well 144 and the N doped region 146. This mode of operating ESD protection device 130, which comprises bypass the positive electrostatic pulse to the ground voltage line VSS, is called positive pulse VSS mode. Consequently, the ESD protection device provided in the present invention is capable of effectively and quickly bypass the positive electrostatic pulse to the ground voltage line VSS and the system voltage line VDD in order to protect the internal circuit 110 from damage caused by the ESD.

When a negative electrostatic pulse which is generally much lower than the ground voltage VSS enters into the internal circuit 110 via the pad 120, the reverse-biased junction of the N doped region 146 and the P well 144 breaks down immediately, thus lowering the voltage $V_{PW}$ of the floating P well 144. Hence, a high current flows from the N doped region 146 through the P well 144. This high current immediately makes the voltage $V_{PW}$ of floating P well 144 larger than the pad voltage $V_{PAD}$ due to the internal resistance. Hence, the base-emitter voltage $V_{BE}$ of the lateral NPN transistor and the vertical NPN transistor (the difference of the floating P well voltage $V_{PW}$ and the pad voltage $V_{PAD}$) higher than the threshold voltage for turning on the transistors. Therefore, the ESD protection device 130 is turned on immediately. As the ESD protection device 130 is turned on, the negative electrostatic pulse due to the ESD is introduced to the system voltage line VDD via the N doped region 145, through the P well 144 and the N well comprising high voltage N well 142 and N buried layer 143. This mode of operating ESD protection device 130, which comprises bypass the negative electrostatic pulse to the system voltage line VDD, is called negative pulse VDD mode. Also, as the ESD protection device 130 is turned on, the negative electrostatic pulse is bypass to the ground voltage line VSS via the N doped region 145, through the P well 144 and the N doped region 146. This mode of operating ESD protection device 130, which comprises bypass the negative electrostatic pulse to the ground voltage line VSS, is called negative pulse VSS mode. Therefore, the ESD protection device described in the present invention is capable of effectively and quickly introducing the negative electrostatic pulse to the ground voltage line VSS and the system voltage line VDD in order to prevent protect the internal circuit 110 from damage caused by ESD.

Figure 2:
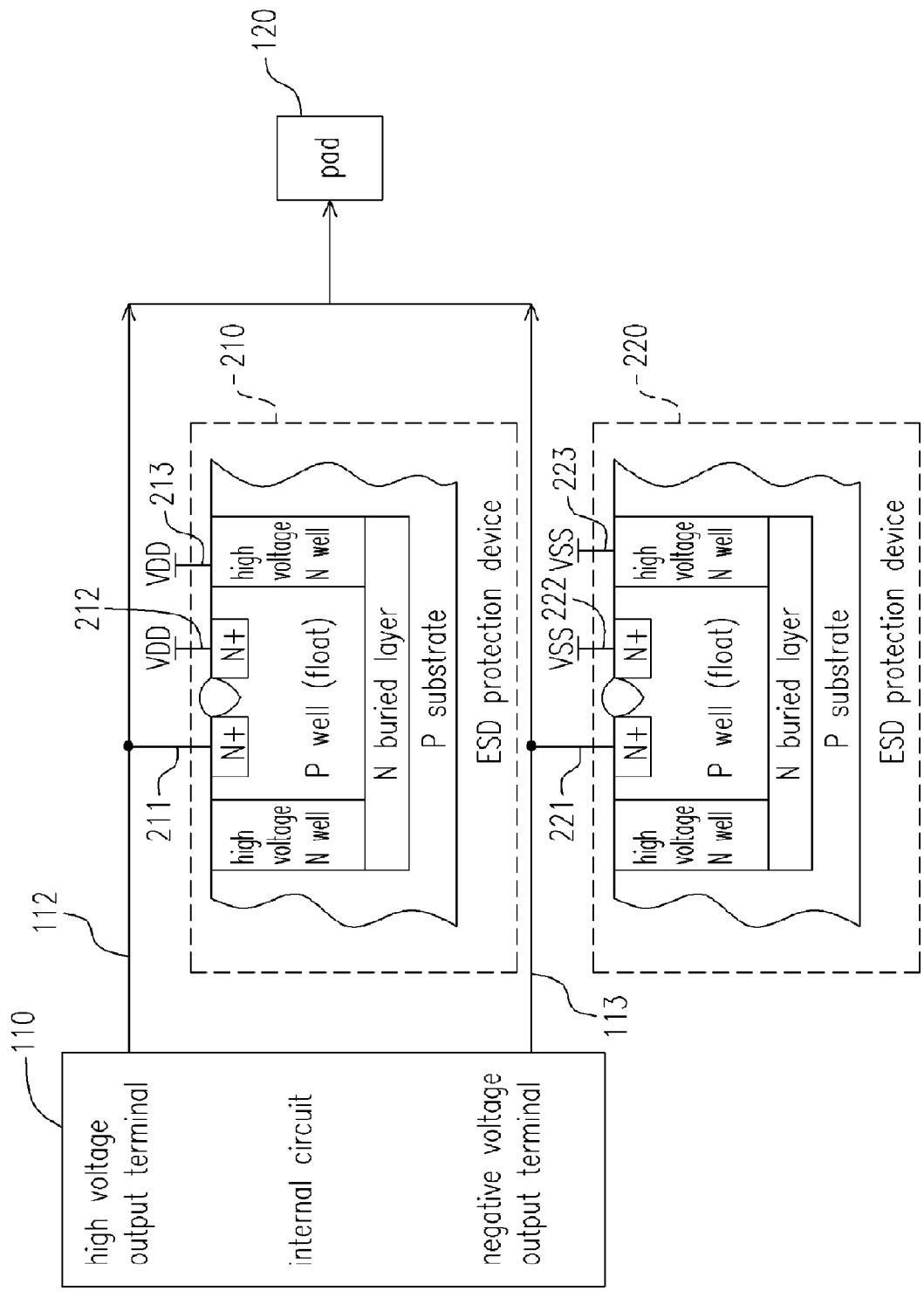
FIG. 2 illustrates the circuit diagram of an ESD protection device providing both high and negative voltage protection, in accordance with another embodiment of the present invention.

A second embodiment of the ESD protection device of the present invention is described with reference to FIG. 2. FIG. 2 illustrates the circuit diagram of an ESD protection device providing both high and negative voltage protection, in accordance with another embodiment of the present invention. Within the IC package, an internal circuit 110 is protected by the ESD protection devices 210 and 220. The bonding pad 120 is a coupling element that connects the internal circuit 110 to the IC package. The internal circuit 110 outputs a high (positive) voltage signal using high voltage terminal 112 and a negative voltage signal using negative voltage terminal 113. Both the positive and the negative voltage signals are transmitted outside the IC via the pad 120. The ESD protection devices 210 and 220 (which are similar to ESD protection device 130 described with reference to FIG. 1) are coupled to high voltage terminal 112 and negative voltage terminal 113 respectively.

According to one embodiment of the present invention, ESD protection terminal 211 of ESD protection device 210 is coupled to the high voltage terminal 112. The discharging terminals 212 and 213 are coupled to the system voltage line VDD. The ESD protection terminal 221 of the ESD protection device 220 is coupled to negative voltage terminal 113 and discharging terminals 222 and 223 are coupled to the ground voltage line VSS. As long as the voltages of the high voltage terminal 112 and the negative voltage terminal 113 are within the working voltage range, the ESD protection devices 210 and 220 remain in a cut off state. However, when a positive or a negative electrostatic pulse enters the internal circuit 110 via pad 120, the ESD protection devices 210 and 220 are turned on quickly. Hence, the present invention can effectively and quickly introduce the positive or the negative electrostatic pulse current to the ground voltage line VSS and the system voltage line VDD in order to protect the internal circuit 110 from damage caused by ESD. The operation of the ESD protection devices 210 and 220 is similar to the operation of ESD protection device 130 described with reference to FIG. 1 and hence, will not be described in details.

The above description provides a full and complete description of the preferred embodiments of the present invention. Various modifications, alternate constructions, and equivalents may be made by those skilled in the art without changing the scope or departing from the spirit of the present invention. Accordingly, the above description and illustrations should not be construed as limiting the scope of the invention which is defined by the following claims.

What is claimed is:

1. An electrostatic discharge protection device with positive voltage and negative voltage tolerance, the device being connected to a pad in an integrated circuit, the device comprising:

a first type substrate;

a first type well, disposed inside the first type substrate, the first type well being in a floating state;

a second type well, disposed inside the first type substrate, the second type well separating the first type well from the first type substrate, the second type well being coupled to a first voltage line;

a second type first doped region, disposed inside the first type well, the second type first doped region being coupled to a second voltage line;

a second type second doped region, disposed inside the first type well and coupled to the pad; and an isolation structure between the second type first doped region and the second type second doped region.

2. The device of claim 1, wherein the first type is a P type and the second type is an N type.

3. The device of claim 1, wherein the second type well comprises a deep second type well.

4. The device of claim 1, wherein the second type well comprises a second type buried layer and a high voltage second type well.

5. The device of claim 1, wherein the isolation structure is a field oxide region.

6. The device of claim 1, wherein the isolation structure is a shallow trench isolation region.

7. The device of claim 1, wherein a voltage of the first voltage line is a system voltage, and a voltage of the second voltage line is a ground voltage.

8. The device of claim 1, wherein a voltage of the first voltage line and a voltage of the second voltage line are system voltages.

9. The device of claim 1, wherein a voltage of the first voltage line and a voltage of the second voltage line are ground voltage.

10. An electrostatic discharge protection device with positive voltage and negative voltage tolerance, for protecting an internal circuit in an integrated circuit, the internal circuit comprising at least a positive voltage input/output terminal and a negative voltage input/output terminal, the device comprising:

a first type substrate;

a first type first well, disposed inside the first type substrate, the first type first well being in a floating state;

a second type first well, disposed inside the first type substrate, the second type first well separating the first type first well from the first type substrate, the second type first well being coupled to a system voltage line;

a second type first doped region, disposed inside the first type first well and coupled to the system voltage line;

a second type second doped region, disposed inside the first type first well and coupled to the positive voltage input/output terminal;

a first isolation structure, disposed between the second type first doped region and the second type second doped region;

a first type second well, disposed inside the first type substrate, the first type second well being in a floating state;

a second type second well, disposed inside the first type substrate separating the first type second well from the first type substrate, the second type second well being coupled to a ground voltage line;

a second type third doped region, disposed inside the first type second well, the second type third doped region being coupled to the ground voltage line;

a second type fourth doped region, disposed inside the first type second well and coupled to the negative voltage input/output terminal; and a second isolation structure between the second type third doped region and the second type fourth doped region.

11. The device of claim 10, wherein the first type is a P type and the second type is an N type.

12. The device of claim 10, wherein each of the second type first well and the second type second well comprises a deep second type well.

13. The device of claim 10, wherein each of the second type first well and the second type second well comprises a second type buried layer and a high voltage second type well.

14. The device of claim 10, wherein each of the first isolation structure and the second isolation structure is a field oxide region.

15. The device of claim 10, wherein each of the first isolation structure and the second isolation structure is a shallow trench isolation region.

* * * * *